(12) United States Patent
Adam et al.

(10) Patent No.: US 8,946,064 B2
(45) Date of Patent: Feb. 3, 2015

(54) TRANSISTOR WITH BURIED SILICON GERMANIUM FOR IMPROVED PROXIMITY CONTROL AND OPTIMIZED RECESS SHAPE

(75) Inventors: Thomas N. Adam, Round Rock, TX (US); Judson R. Holt, Wappingers Falls, NY (US); Alexander Reznicek, Mount Kisco, NY (US); Thomas A. Wallner, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 154 days.

(21) Appl. No.: 13/161,913

(22) Filed: Jun. 16, 2011

(65) Prior Publication Data
US 2012/0319166 A1    Dec. 20, 2012

(51) Int. Cl.
*H01L 21/20* (2006.01)
*H01L 29/10* (2006.01)
*H01L 29/66* (2006.01)
(Continued)

(52) U.S. Cl.
CPC ...... *H01L 29/1054* (2013.01); *H01L 29/66636* (2013.01); *H01L 29/66742* (2013.01); *H01L 29/7848* (2013.01); *H01L 29/78687* (2013.01); *H01L 29/045* (2013.01)
USPC ........... 438/481; 438/689; 438/300; 438/285; 438/151; 438/8; 257/E21.092; 257/E21.102; 257/E21.615

(58) Field of Classification Search
CPC ..................... H01L 29/1054; H01L 29/66636; H01L 29/66742; H01L 29/78687; H01L 29/045; H01L 29/7848
USPC ............ 438/8, 151, 197, 285, 290, 300, 481, 438/469, 142, 938, 689; 257/E21.092, 257/E21.102, E21.615
See application file for complete search history.

(56) References Cited

U.S. PATENT DOCUMENTS 5,891,769 A * 4/1999 Liaw et al. .................... 438/167
6,872,621 B1   3/2005 Wu
(Continued)

FOREIGN PATENT DOCUMENTS

DE   WO2006005321   * 1/2006   .............. H01L 21/00
WO   2006/005321 A2   1/2006

OTHER PUBLICATIONS

King E.E., et al., "CMOS on bonded wafers fabricated using a novel Si—Ge etch stop" SOI Conference, 1991. Proceedings, 1991., IEEE International, Publication Year: 1991, pp. 112-113.
(Continued)

*Primary Examiner* — Galina Yushina
(74) *Attorney, Agent, or Firm* — Scully, Scott, Murphy & Presser, P.C.; Daniel P. Morris, Esq.

(57) ABSTRACT

A method of forming a semiconductor device that includes providing a substrate including a semiconductor layer on a germanium-containing silicon layer and forming a gate structure on a surface of a channel portion of the semiconductor layer. Well trenches are etched into the semiconductor layer on opposing sides of the gate structure. The etch process for forming the well trenches forms an undercut region extending under the gate structure and is selective to the germanium-containing silicon layer. Stress inducing semiconductor material is epitaxially grown to fill at least a portion of the well trench to provide at least one of a stress inducing source region and a stress inducing drain region having a planar base.

8 Claims, 8 Drawing Sheets

(51) Int. Cl.
*H01L 29/78* (2006.01)
*H01L 29/786* (2006.01)
*H01L 29/04* (2006.01)
*H01L 21/302* (2006.01)

(56) References Cited

U.S. PATENT DOCUMENTS

| | | | |
|---|---|---|---|
| 7,227,176 B2 | 6/2007 | Wu et al. | |
| 7,348,611 B2 | 3/2008 | Ieong et al. | |
| 7,494,856 B2 | 2/2009 | Zhang et al. | |
| 7,494,858 B2 | 2/2009 | Bohr et al. | |
| 7,525,161 B2 | 4/2009 | Ieong et al. | |
| 7,755,171 B2* | 7/2010 | Zhu | 257/623 |
| 7,821,044 B2 | 10/2010 | Bohr et al. | |
| 7,951,657 B2* | 5/2011 | Cheng et al. | 438/151 |
| 8,022,488 B2* | 9/2011 | Cheng et al. | 257/408 |
| 2005/0093021 A1* | 5/2005 | Ouyang et al. | 257/194 |
| 2006/0081836 A1 | 4/2006 | Kimura et al. | |
| 2007/0004123 A1 | 1/2007 | Bohr et al. | |
| 2007/0254422 A1* | 11/2007 | Chidambarrao et al. | 438/197 |
| 2008/0119025 A1 | 5/2008 | Kwon et al. | |
| 2008/0135873 A1 | 6/2008 | Fiorenza et al. | |
| 2008/0135894 A1 | 6/2008 | Bohr et al. | |
| 2008/0179627 A1 | 7/2008 | Ieong et al. | |
| 2008/0203491 A1 | 8/2008 | Anderson et al. | |
| 2008/0237634 A1 | 10/2008 | Dyer et al. | |
| 2008/0258180 A1* | 10/2008 | Chen et al. | 257/255 |
| 2008/0261055 A1 | 10/2008 | Chu et al. | |
| 2009/0152646 A1* | 6/2009 | Zhu et al. | 257/408 |
| 2010/0078689 A1* | 4/2010 | Kronholz et al. | 257/288 |
| 2010/0102356 A1* | 4/2010 | Murthy et al. | 257/190 |
| 2010/0184265 A1* | 7/2010 | Maitra et al. | 438/303 |
| 2010/0295127 A1 | 11/2010 | Cheng et al. | |
| 2012/0153387 A1 | 6/2012 | Murthy et al. | |

OTHER PUBLICATIONS

Isaacson, D.M, et al., Relaxed graded SiGe donor substrates incorporating hydrogen-gettering and buried etch stop layers for strained silicon layer transfer applications.Journal of Applied Physics, vol. 101, No. 1, pp. 13522-1-13522-9, Jan. 1, 2007.

IP.com, Inc., Technical Disclosure "Dual-Trench-Isolated Tri-Gate Technology" www.ip.com, IPCOM000145442D, Jan. 17, 2007.

U.S. Final Office Action dated May 22, 2014 from related U.S. Appl. No. 13/608,250.

U.S. Office Action dated Dec. 27, 2013 from related U.S. Appl. No. 13/608,250.

* cited by examiner

TRANSISTOR WITH BURIED SILICON GERMANIUM FOR IMPROVED PROXIMITY CONTROL AND OPTIMIZED RECESS SHAPE

BACKGROUND

The present disclosure relates to microelectronic devices. More particularly, the present disclosure relates to forming stress inducing materials in semiconductor materials.

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

SUMMARY

The present disclosure provides a semiconductor structure, and a method of fabricating the same. The semiconductor structure includes stress inducing source and drain regions on opposing sides of the gate structure, in which a germanium-containing silicon layer is present within the substrate that functions as an etch stop during the process sequence for forming strain inducing source and drain regions.

In one aspect, a method of forming a semiconductor device is provided that includes providing a substrate including a semiconductor layer on a germanium-containing silicon layer. A gate structure is formed on a surface of a channel portion of the semiconductor layer of the substrate. Well trenches are then formed on opposing sides of the gate structure, in which the etch process for forming the well trenches forms an undercut region extending under the gate structure. The etch process for forming the well trenches is selective to the germanium-containing silicon layer. A stress inducing semiconductor material is then epitaxially grown on the germanium-containing silicon layer to fill at least a portion of the well trench to provide a stress inducing source region and/or stress inducing drain region having a planar base.

In another aspect, a semiconductor device is provided that includes a substrate composed of a semiconductor layer and germanium-containing silicon layer, wherein the semiconductor layer provides a channel portion of the semiconductor device. A gate structure is present on the channel portion of the semiconductor layer. Stress inducing source and drain regions are present on opposing sides of the channel portion of the semiconductor layer, and provide the source and drain regions of the semiconductor device. The stress inducing source and drain regions include an undercut portion that extends under the gate structure and have a planar base defined by the germanium-containing silicon layer.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Detailed embodiments of the method and structures of the present disclosure are described herein; however, it is to be understood that the disclosed embodiments are merely illustrative of the methods and structures that may be embodied in various forms. In addition, each of the examples given in connection with the various embodiments of the disclosed methods and structures are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures disclosed herein.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

Semiconductor device performance enhancements, such as increased charge carrier speed, may be provided by introducing a stress, e.g., tensile or compressive stress, to the channel region of the semiconductor device, e.g., n-type or p-type field effect transistor (FET). The stress may be induced to the channel region of a FET by positioning a well trench composed of a stress inducing material, i.e., stress inducing source region and/or stress inducing drain region, adjacent to the channel region of the FET. To increase the stress in the channel region produced by the stress inducing source and drain regions, the stress inducing source and drain regions are positioned as close as possible to the channel region. For example, the stress inducing source and drain regions can be brought closer to the channel region by forming the stress inducing source and drain regions within an undercut region that extends beneath the sidewall spacers that are adjacent to the gates structure of the FET. It has been determined that the proximity of the stress inducing source and drain regions to the channel region is limited by the etch process used to form the well trenches that contain the stress inducing source and drain regions. More specifically, as the lateral etching is increased to provide the undercut region, the depth by which the well trench extends into the substrate is also increased. Further, as the trench depth increases, the planarity of the base of the trench degrades. For example, as the planarity of the base of the trench degrades with increasing trench depth, the base of the trench may have a cross-sectional geometry of a triangle, in which the apex of the triangle is positioned at the greatest depth of the trench in the substrate. In order to place the apex of the under-etched sidewall triangle as close as possible to the device channel on the top of the silicon, shallow well trenches are combined with deep re-shaping etches. A well trench having a non-planar base obstructs uniform epitaxial growth of the stress inducing material of the stress inducing source and drain regions.

In one aspect, the present disclosure provides a method of forming a semiconductor device, and the structure formed therefrom, in which stress inducing source and drain regions are positioned closer to the channel region of the semiconductor device by utilizing a germanium-containing silicon layer positioned within the substrate as an etch stop to limit the depth by which the well trenches are etched into the substrate. In this manner, the etch that is used to form the well trenches can laterally etch the substrate to form an undercut region extending to a greater degree under the spacers that are adjacent to the gate structure, while controlling the depth by which the well trenches are etched into the substrate. As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. As used herein a "field effect transistor" is a semiconductor device, e.g., transistor, in which output current, i.e., source-drain current, is controlled by the voltage applied to the gate. A field effect transistor (FET) has three terminals, i.e., gate, source and drain.

Figure 1A:
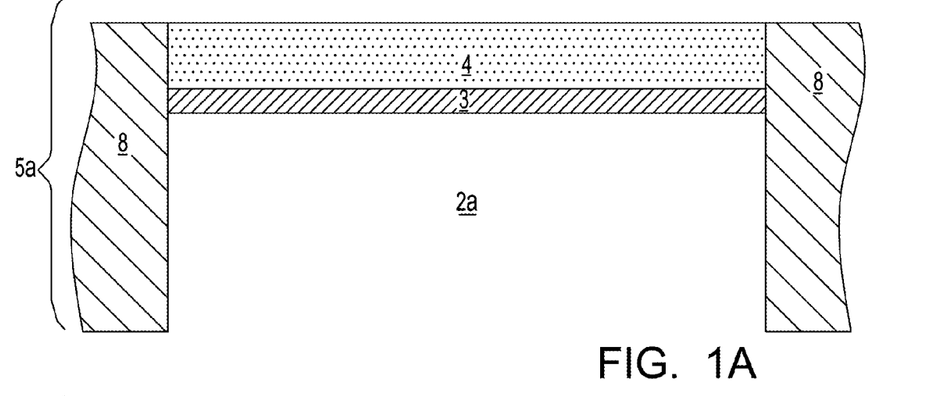
FIG. 1A is a side cross-sectional view depicting one embodiment of a substrate including a semiconductor layer on a germanium-containing silicon layer that is present on a bulk substrate, in accordance with the present disclosure.

FIG. 1A depicts one embodiment of a substrate 5a that may be employed in a method of forming a semiconductor device including stress inducing source and drain regions, in accordance with one embodiment of the present disclosure. In one embodiment, the substrate 5a includes a base substrate 2a and a top semiconductor layer (semiconductor layer 4), in which a germanium-containing silicon layer 3 separates the base substrate 2a and the semiconductor layer 4.

In one embodiment, the semiconductor layer 4 is composed of a silicon-containing material. In one embodiment, the semiconductor layer 4 is a silicon-containing material that is greater than 90% silicon. In another embodiment, the semiconductor layer 4 is a silicon-containing material that is greater than 95% silicon. In yet another embodiment, the semiconductor layer 4 is comprised of greater than 99% silicon, e.g., 100% silicon. The aforementioned percentages allow for doping with n-type and p-type dopants. The semiconductor layer 4 may have a thickness ranging from 1 nm to 200 nm. In another embodiment, the semiconductor layer 4 may have a thickness ranging from 5 nm to 70 nm. The semiconductor layer 4 is crystalline.

The base substrate 2a may be comprised of the same or a different material than the semiconductor layer 4. In one embodiment, the base substrate 2a may comprise at least one of Si, Ge, SiGe, GaAs, InAs, InP, SiCGe, SiC, as well as other III/V or II/VI compound semiconductors and alloys thereof. The base substrate 2a may have a thickness ranging from 5 nm to 1000 nm.

The germanium-containing silicon layer 3 that is separating the semiconductor layer 4 and the base substrate 2a may be composed of silicon germanium that comprises greater than 20% germanium. For example, the germanium content of the silicon germanium base substrate 2a may range from 20% to 25%. It is noted, that other concentrations of germanium have also been considered. Typically, as the germanium content of the germanium-containing silicon layer 3 is increased, the etch selectivity to the germanium-containing silicon layer 3 in accordance with the present method is also increased. In one embodiment, the germanium-containing silicon layer 3 may be composed of silicon germanium that comprises greater than 50% germanium. In another embodiment, the germanium-containing silicon layer 3 may be composed of silicon germanium that comprises greater than 75% germanium. It is noted that in some embodiments, the germanium-containing silicon layer 3 may be doped with carbon, in which the carbon dopant can be present in up to 5%. The germanium-containing silicon layer 3 may have a thickness ranging from 1 nm to 100 nm. In another embodiment, the germanium-containing silicon layer 3 may have a thickness ranging from 5 nm to 20 nm. The above dimensions for the thickness of the germanium-containing silicon layer 3 are provided for illustrative purposes only, and are not intended to limit the present disclosure. It is noted that any thickness may be provided, so long as the germanium-containing silicon layer 3 is thick enough to provide an etch stop, while keeping the germanium-containing silicon layer 3 as thin as possible so that the electrical performance of the device is not influenced by the germanium-containing silicon layer.

Still referring to FIG. 1A, the substrate 5a may be formed using deposition and growth processes. For example, in one embodiment, a germanium-containing silicon layer 3 may be deposited atop a base substrate 2a that is provided by a silicon-containing bulk substrate. In one embodiment, the germanium-containing silicon layer 3 is deposited by chemical vapor deposition (CVD). Chemical vapor deposition (CVD) is a deposition process in which a deposited species is formed as a result of chemical reaction between gaseous reactants at room temperature or greater, wherein solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), Metal-Organic CVD (MOCVD), Ultra-high vacuum CVD (UHV-CVD) and combinations thereof. Other examples of processed for depositing the germanium-containing silicon layer 3 include atomic layer deposition (ALD), evaporation, chemical solution deposition and other like deposition processes. The semiconductor layer 4 may then be deposited atop the germanium-containing silicon layer 3. Similar to the germanium-containing silicon layer 3, the semiconductor layer 4 may be deposited using CVD, e.g., APCVD, LPCVD, PECVD, MOCVD, UHV-CVD and combinations thereof. The semiconductors layer 4 may also be on epitaxially grown layer.

Figure 1B:
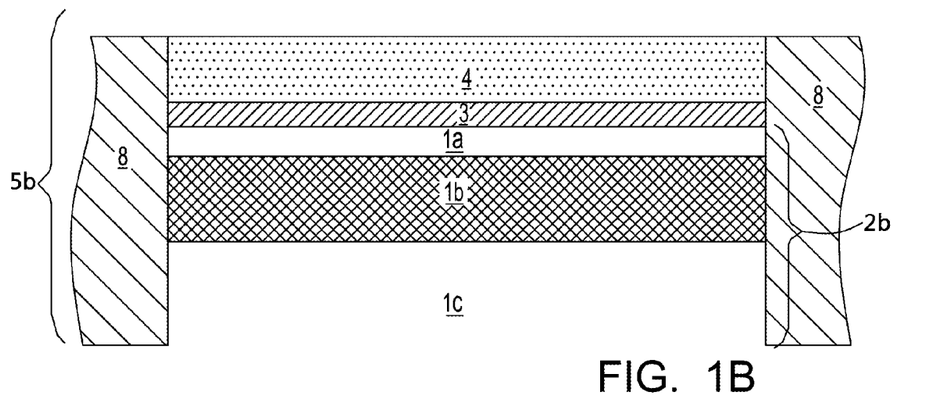
FIG. 1B is a side cross-sectional view depicting one embodiment of a substrate including a semiconductor layer on a germanium-containing silicon layer that is present on a semiconductor on insulator (SOI) substrate, in accordance with the present disclosure.

FIG. 1B depicts one embodiment of a substrate 5b including a semiconductor layer 4 on a germanium-containing silicon layer 3 that is present on a base substrate 2b that is provided by a semiconductor on insulator (SOI) substrate. The semiconductor-on-insulator (SOI) substrate may include a bottom semiconductor layer 1c and a semiconductor-on-insulator (SOI) layer 1a. The SOI layer 1a and the second semiconductor layer 1c are electrically isolated from each other by a buried insulating layer 1b. The SOI layer 1a, and the bottom semiconductor layer 1c, may comprise at least one of Si, Ge, SiGe, GaAs, InAs, InP, SiCGe, SiC as well as other III/V or II/VI compound semiconductors and alloys thereof. Practical thicknesses of the SOI layer 1a may range from 1 nm to 100 nm. The bottom semiconductor layer 1c may have a thickness ranging from 5 nm to 1000 nm. The buried insulating layer 1b separating the SOI layer 1a and the bottom semiconductor layer 1c may be a crystalline or non-crystalline oxide, nitride, oxynitride, or any other suitable insulating material. The buried insulating layer 1b may have a thickness ranging from 1 nm to 500 nm, and may be composed of a single material layer or may be a multilayer structure. The semiconductor layer 4 and the germanium-containing silicon layer 3 are formed on the SOI substrate using methods that are similar to those described above for forming the semiconductor layer 4 and the germanium-containing silicon layer 3 on the bulk substrate that is depicted in FIG. 1A.

Figure 1C:
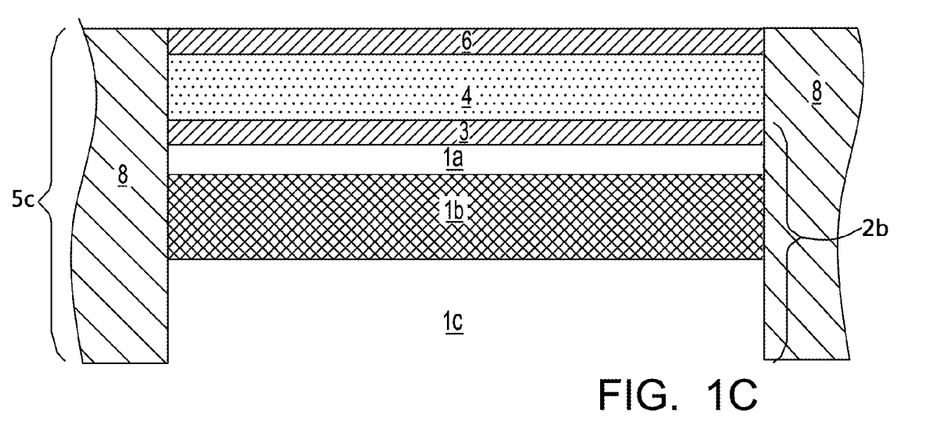
FIG. 1C is a side cross-sectional view depicting one embodiment of a substrate including a silicon germanium layer on a semiconductor layer, wherein the semiconductor layer is on a germanium-containing silicon layer, and the germanium-containing silicon layer is present on a base substrate, in accordance with the present disclosure.

FIG. 1C depicts one embodiment of a substrate 5c including a silicon germanium (SiGe) layer 6, which provides the upper surface of the substrate 5c. In one embodiment, the SiGe layer 6 is present on a material stack of a semiconductor layer 4 and a germanium-containing silicon layer 3, in which the material stack is present on a base substrate 2b provided by an SOI substrate. The semiconductor layer 4, the germanium-containing silicon layer 3, and the SOI substrate are described above with reference to FIGS. 1A and 1B. The SiGe layer 6 may be a single crystal material layer deposited to a thickness ranging from 1 nm to 50 nm. In another embodiment, the SiGe layer 6 may be a single crystal material layer deposited to a thickness ranging from 3 nm to 6 nm. The SiGe layer 6 may be deposited using CVD, e.g., APCVD, LPCVD, PECVD, MOCVD, UHV-CVD and combinations thereof.

Referring to FIGS. 1A-1C, the substrate 5a, 5b, 5c may also include at least one isolation region 8, such as a shallow trench isolation (STI) region. The isolation regions 8 may comprise any of several dielectric isolation materials. Non-limiting examples include oxides, nitrides and oxynitrides, particularly of silicon, but oxides, nitrides and oxynitrides of other elements are not excluded. In one embodiment, the isolation regions 8 primarily comprise an oxide of silicon.

Figure 2:
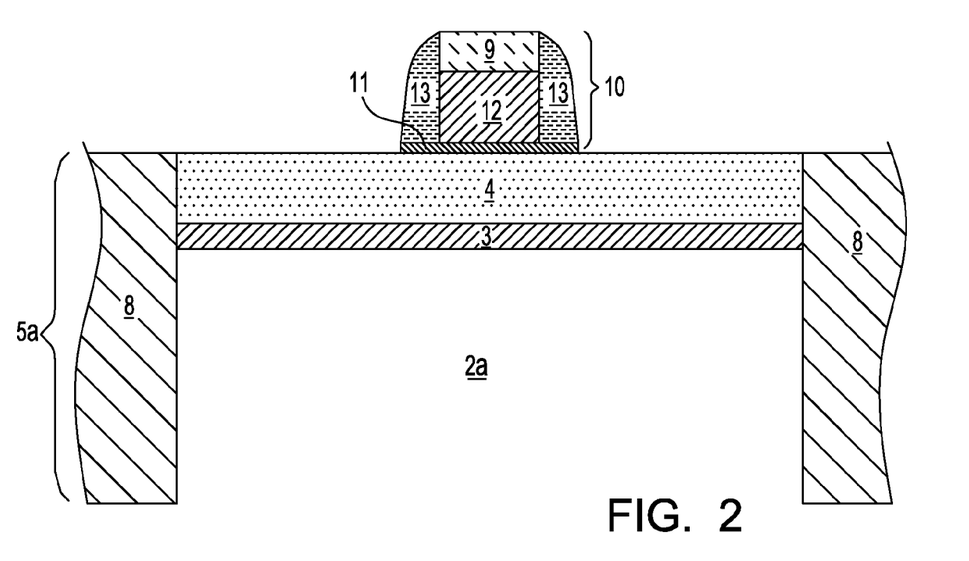
FIG. 2 is a side cross-sectional view of forming a gate structure on a surface of a channel portion of the semiconductor layer of the substrate depicted in FIG. 1A, in accordance with one embodiment of the present disclosure.

FIG. 2 depicts one embodiment of forming a gate structure 10 on the upper surface of the substrate 5a. In the embodiment that is depicted in FIG. 2, the gate structure 10 is illustrated as being formed on the substrate 5a that is depicted in FIG. 1A, but the process and structures described with reference to FIG. 2 are equally applicable to the substrates 5b, 5c that are depicted in FIGS. 1B and 1C. A "gate structure" means a structure used to control output current (i.e., flow of carriers in the channel) of a semiconducting device through electrical or magnetic fields. The gate structure 10 may include at least one gate conductor 12 atop at least one gate dielectric 11. The gate structure 10 can be formed using deposition, photolithography and a selective etching process. For example, material layers for the gate dielectric 11 and gate conductor 12 of the gate structure 10 may be blanket deposited on the upper surface of the substrate 5a, e.g., upper surface of the semiconductor layer 4 of the substrate 5a. Following deposition, the material layers are patterned and etched to provide gate structure 10. Specifically, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions. In one embodiment, a hard mask (hereafter referred to as a dielectric cap 9) may be used to form the gate structure 10. The dielectric cap 9 may be formed by first depositing a dielectric hard mask material, like $Si_3N_4$ or $SiO_2$, atop a layer of the uppermost gate electrode material and then applying a photoresist pattern to the hard mask material using a lithography process steps. The photoresist pattern is transferred into the hard mask material using a dry etch process forming the dielectric cap 9.

In a following process sequence, the photoresist pattern is removed and the pattern from the dielectric cap 9 is transferred into the gate conductor material 12 using a selective etching process that is selective to the material layer that provides the gate dielectric 11. As used herein, the term "selective" in reference to a material removal process denotes that the rate of material removal for a first material is greater than the rate of removal for at least another material of the structure to which the material removal process is being applied. For example, the etch selectivity for removing the material of the gate conductor 12 to the gate dielectric 11 and the dielectric cap 9 may be greater than 100:1.

The selective etch process may be an anisotropic etch, such as reactive ion etching, or the selective etch process may be an isotropic etch, such as a wet chemical etch.

At least one spacer 13 can be formed in direct contact with the sidewalls of the gate conductor 12, and on the upper surface of the material layer that provides the gate dielectric 11. The at least one spacer 13 may be formed using a conformal deposition method in combination with an etch process space. The at least one spacer 13 typically has a width as measured from its base ranging from 2.0 nm to 15.0 nm. The at least one spacer 13 may be composed of a dielectric, such as nitride, oxide, oxynitride, or a combination thereof. In one embodiment, the at least one spacer 13 and the dielectric cap 9 are both composed of silicon nitride. In one embodiment, following the formation of the at least one spacer 13, the portions of the material layer that provides the gate dielectric 11 are etched selectively to the dielectric cap 9, the at least one spacer 13, and the upper surface of the substrate 5a, e.g., the upper surface of the semiconductor layer 4.

The at least one gate conductor 12 may be any conductive metal including, but not limited to W, Ni, Ti, Mo, Ta, Cu, Pt, Ag, Au, Ru, Ir, Rh, and Re, and alloys that include at least one of the aforementioned conductive elemental metals. The at least one gate conductor 12 may also be a doped semiconductor material, such as a doped silicon containing material, e.g., n-type or p-type doped polysilicon. When a combination of conductive elements is employed, e.g., metal and semiconductor containing gate conductors, an optional diffusion barrier material, such as TaN or WN may be formed between the conductive materials.

The at least one gate dielectric 11 may be a dielectric material, such as $SiO_2$, or alternatively high-k dielectrics (i.e, dielectrics having a dielectric constant silicon oxide), such as oxides of Ta, Zr, Al or combinations thereof. In another embodiment, the first gate dielectric layer 9 is comprised of an oxide, such as $SiO_2$, $ZrO_2$, $Ta_2O_5$ or $Al_2O_3$. In one embodiment, the gate dielectric 11 has a thickness ranging from 1 nm to 10 nm. In another embodiment, the gate dielectric layer 11 has a thickness ranging from 1.5 nm to 2.5 nm.

Figure 3:
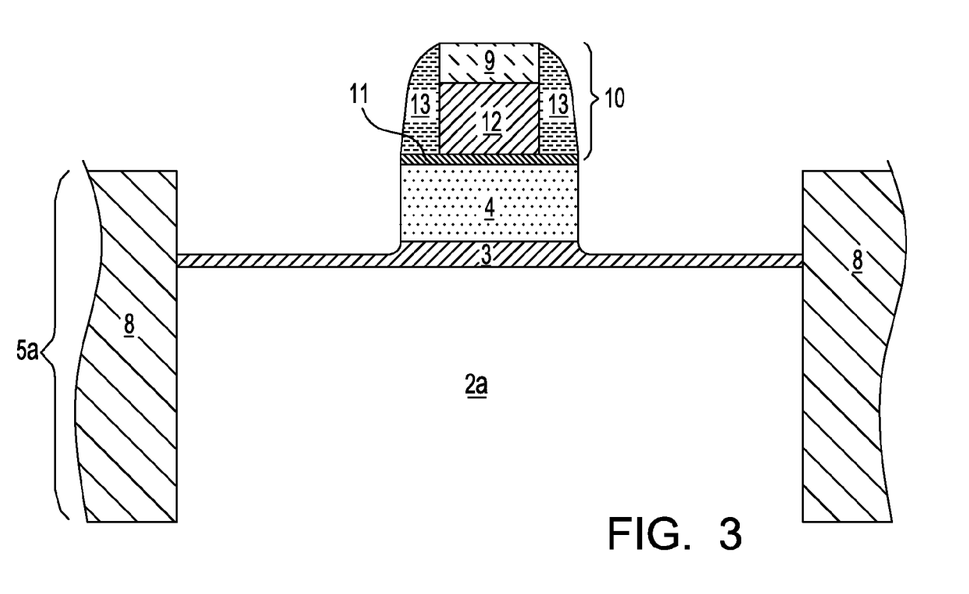
FIG. 3 is a side cross-sectional view of one embodiment of an anisotropic etch that is either timed or selective to the germanium-containing silicon layer of the substrate that provides a first etch process step for forming a well trench, in accordance with one embodiment of the present disclosure.

FIGS. 3-8 depict some embodiments of etching well trenches 15 into the semiconductor layer 4 of the substrate 5a, 5b, 5c on opposing sides of the gate structure 10. FIG. 3 depicts one embodiment of an anisotropic etch that is timed or selective to the germanium-containing silicon layer 3 of the substrate 5a that provides a first etch process step for forming a well trench. A well trench 15 is positioned on each side of the gate structure 10, and provides the site for the subsequently formed stress inducing source and drain regions. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Reactive Ion Etching (ME) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present disclosure include ion beam etching, plasma etching or laser ablation. The etch chemistry of the anisotropic etch is selected to remove the semiconductor layer 4 selective to the germanium-containing silicon layer 3. The etch chemistry of the anisotropic etch may also be selective to the dielectric cap 9 and the at least one spacer 13 of the gate structure 10, as well as the isolation regions 8.

In the embodiment depicted in FIG. 3, the anisotropic etch process is continued until the germanium-containing silicon layer 3 is exposed. The anisotropic etch process may be terminated by timing or using end point detection. Although not depicted in FIG. 3, other embodiments are within the scope of the present disclosure, in which the anisotropic etch does not contact the germanium-containing silicon layer 3.

Figure 4:
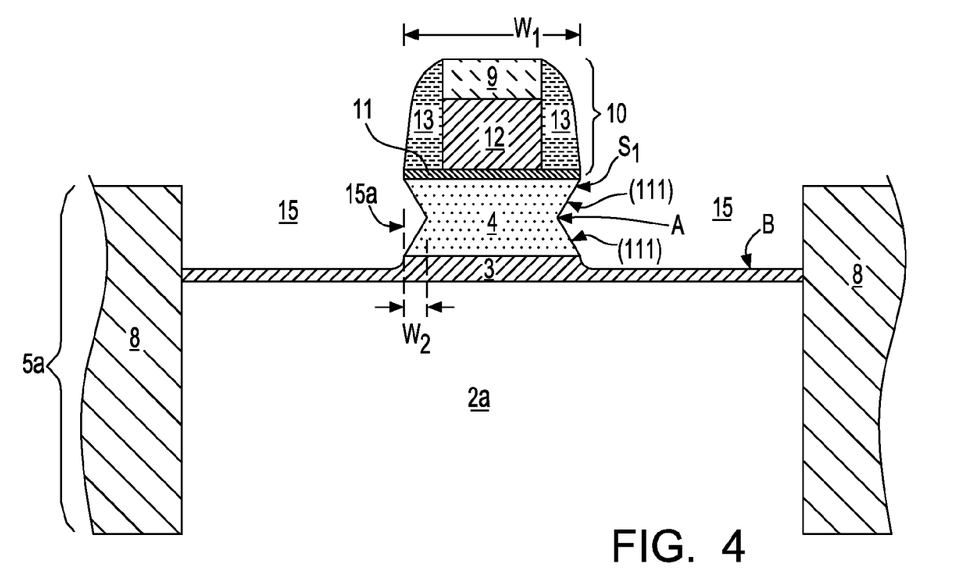
FIG. 4 is a side cross-sectional view of one embodiment of a second etch step that is applied to the structure depicted in FIG. 3 for forming a well trench that includes an undercut etch that is selective to the (111) facet of the semiconductor layer and is selective to the germanium containing silicon layer, in accordance with the present disclosure.

FIG. 4 depicts one embodiment of a second etch step that is applied to the structure depicted in FIG. 3 for forming a well trench 15 that includes an undercut etch that is selective to the (111) facet of the semiconductor layer and is selective to the germanium containing silicon layer. In this embodiment, the semiconductor layer 4 is silicon having a (100) surface orientation, and the length of channel of the device is to be parallel with the <110> direction of the semiconductor layer 4. The channel is the region underlying the gate structure 10 between the source and drain region of a semiconductor device that becomes conductive when the semiconductor device is turned on. In one embodiment, the source region is a doped region in the semiconductor device, in which majority carriers are flowing into the channel. In one embodiment, the drain region is the doped region in semiconductor device located at the end of the channel, through which the carriers are flowing out of the semiconductor device. The length of the channel is the dimension separating the source and drain regions.

The undercut etch is an etch process that laterally etches the semiconductor layer 4, i.e., etches the semiconductor layer 4 in a direction parallel to the upper surface of the substrate 5a, to form an undercut region 15a that extends underneath the at least one spacer 13 of the gate structure 10. In one embodiment, the undercut etch is selective to the (111) facet of a silicon-containing semiconductor layer 4, and to the germanium-containing silicon layer 3. The undercut etch may be a wet etch process. Hydroxide-containing etch chemistries are one example of a family of etch chemistries that may be selective to the (111) facet of a semiconductor layer 4 composed of a silicon-containing material, e.g., 95% silicon or greater material, in which the hydroxide-containing etch chemistries may also be selective to the germanium-containing silicon layer 3. Some examples of hydroxide-containing etch chemistry compositions that are selective to the (111) facet of a semiconductor layer 4 composed of a silicon-containing material, which are also selective to the germanium-containing silicon layer 3 include tetramethylammonium hydroxide (TMAH), ammonium hydroxide ($NH_4OH$), and combinations thereof. Other etch chemistries that are suitable for this stage of the present disclosure include lithium hydroxide (LiOH), and potassium hydroxide (KOH).

Still referring to FIG. 4, the undercut etch forms an undercut region 15a having sidewalls defined by two (111) facets intersecting at an apex A1 underlying the gate structure 10. The sidewall of the undercut region 15a underlying the at least one spacer 13 of the gate structure 10 that is depicted in FIG. 4 may be referred to as a facetted sidewall S1. The term "facetted" means each of the surfaces of the interior sidewall of the undercut region 15a of the well trenches 15 are disposed along a crystalline orientation of the laterally etched semiconductor layer 4. The position of the apex A1 is determined by the initial well recess depth and the forming <111> angle, e.g., ~54. In one embodiment, the limit for the width of the undercut region 15a is /1;2 of the gate length extending from the apex A1 in a direction parallel to the upper surface of the substrate 5a.

The base B of the well trench 15 that is depicted in FIG. 4 is provided by the upper surface of the germanium-containing silicon layer 3 and is therefore planar. Further, because the upper surface of the germanium-containing silicon layer 3 is substantially parallel to the upper surface of the semiconductor layer 4, i.e., upper surface of the substrate 5a, the base B of the well trench 15 is substantially parallel to the upper surface of semiconductor layer 4, i.e., the upper surface of the substrate 5a. The base B of the well trench 15 has a width that extends from the sidewall of the isolation region 8 to at least one facet (111) of the facetted sidewall S1 of the undercut portion 15a of the well trench 15.

Figure 5:
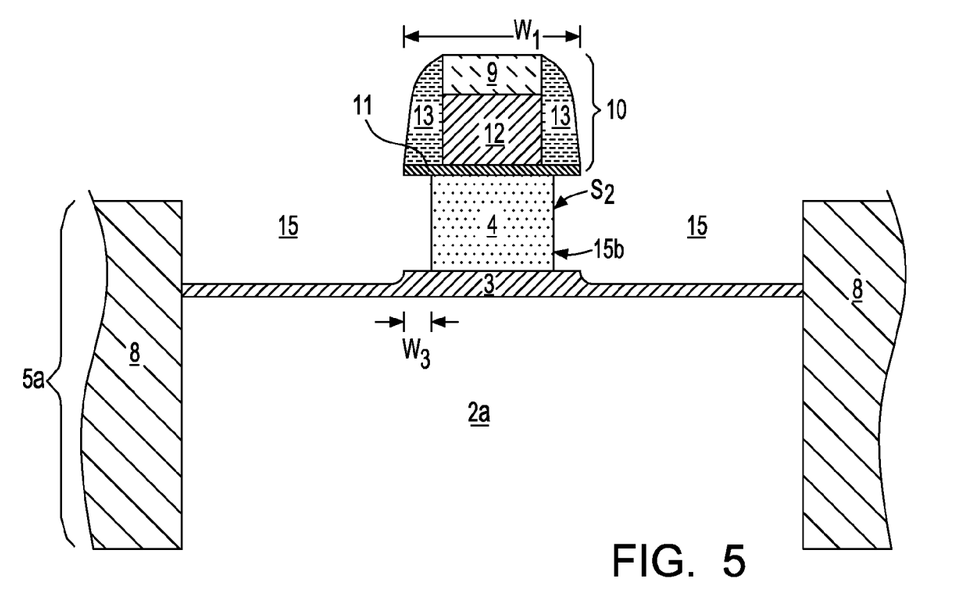
FIG. 5 is a side cross-sectional view of one embodiment of a second etch step that is applied to the structure depicted in FIG. 3 for forming a well trench that includes an undercut etch that forms an undercut region extending under the gate structure that has a sidewall that is perpendicular to an upper surface of the semiconductor layer, in which the semiconductor layer is a semiconductor surface having a (100) crystal orientation that is rotated at 45 degrees so that the channel portion of the semiconductor device is located along the <100> direction, in accordance with the present disclosure.
Figure 6A:
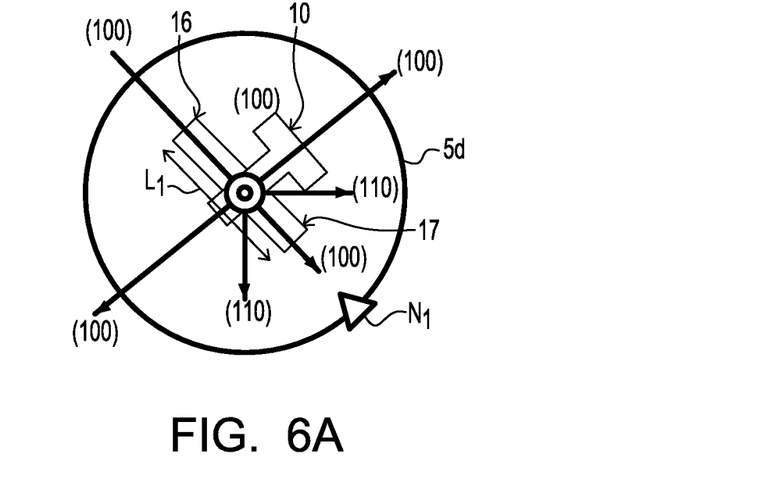
FIG. 6a is a top down schematic view depicting the orientation of a field effect transistor on a 45 degree rotated (100) substrate, in which the notch of the substrate is orientated to the (100) crystalline plane, and the length of the channel of the field effect transistor is parallel to the <100> direction.

FIG. 5 depicts one embodiment of a second etch step that is applied to the structure depicted in FIG. 3 for forming a well trench 15 that includes an undercut region 15b extending under the gate structure 10 that has a sidewall S2 that is perpendicular to an upper surface of the semiconductor layer 4. The perpendicular sidewall S2 is provided by the combination of a wet etch of a hydroxide-containing composition and a 45 degree rotated substrate, as depicted in FIG. 6A. FIG. 6A is a top down schematic view depicting the orientation of a field effect transistor on a (100) substrate that has been rotated 45°, in which the notch N1 of the substrate 5d is orientated to the (100) crystalline plane, and the length L1 of the channel of the field effect transistor is parallel to the <100> direction. The length L1 of the channel is the dimension separating the source 16 and the drain region 17. Etching the substrate orientation that is depicted in FIG. 6A with a two stage etch process including a first etch step with the anisotropic etch, as described with reference to FIG. 3, and a second etch step, i.e., undercut etch, with a wet etch of a hydroxide-containing chemistry forms undercut regions 15b with planar sidewall S2 that are perpendicular to the upper surface of the semiconductor layer 4, as depicted in FIG. 5. Some examples of hydroxide-containing etch chemistry compositions that form an undercut region 15b having a planar sidewall S2 on a 45 degree rotated substrate include tetramethylammonium hydroxide (TMAH), ammonium hydroxide ($NH_4OH$), and combinations thereof. Other etch chemistries that are suitable for this stage of the present disclosure include lithium hydroxide (LiOH), and potassium hydroxide (KOH).

The base B of the well trench 15 that is depicted in FIG. 5 is provided by the upper surface of the germanium-containing silicon layer 3 and is therefore planar. Further, because the upper surface of the germanium-containing silicon layer 3 is substantially parallel to the upper surface of the semiconductor layer 4, i.e., upper surface of the substrate 5a, the base B of the well trench 15 is substantially parallel to the upper surface of semiconductor layer 4, i.e., the upper surface of the substrate 5a. The undercut portion 15b of the well trench 15 may have a width W3 that ranges from 1 nm to ½ the gate length W1, as measured from the exterior sidewall of the spacer 13 to the planar sidewall S2 of the undercut region 15b. In another embodiment, the undercut portion 15b of the well trench 15 may have a width W3 that ranges from 1 nm to 5 nm, as measured from the exterior sidewall of the spacer 13 to the planar sidewall S2 of the undercut region 15b. Although, the well trenches 15 including the undercut region 15b having the planar sidewall S2 is depicted in FIG. 5 as being formed over a base substrate 2a composed of a semiconductor bulk substrate, well trenches 15 having an undercut region 15b with a planar sidewall S2 may also be formed in a semiconductor layer 4 that is overlying a base substrate provided by an SOI substrate.

Figure 6B:
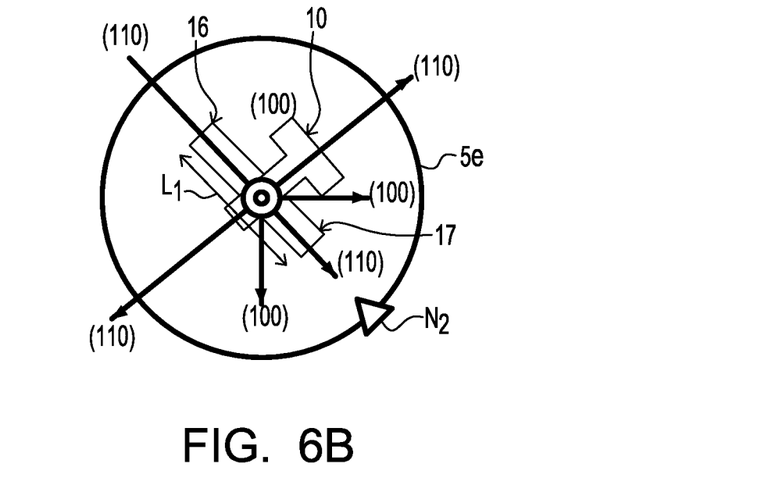
FIG. 6b is a top down schematic view depicting the orientation of a field effect transistor on a (100) substrate, in which the notch of the substrate is orientated to the (110) crystalline plane, and the length of the channel of the field effect transistor is parallel to the <110> direction.

FIG. 6B is a top down schematic view depicting the orientation of a field effect transistor on a non-rotated (100) substrate, in which the notch N2 of the substrate 5e is orientated to the (110) crystalline plane, and the length L1 of the channel of the field effect transistor is parallel to the <110> direction. The embodiments of the present disclosure that are depicted in FIGS. 4, 7a, 7b, 8, 9, 10, 11, 12 and 13 may be formed on the substrate orientation that is depicted in FIG. 6B. FIGS. 1-3 may utilize a 45 degree rotated substrate, as depicted in FIG. 6A, or a non-rotated substrate, as depicted in FIG. 6B. It is noted that FIG. 6B is only one example of a non-rotated substrate, as other substrate crystalline orientations are within the scope of the present disclosure. Further, the field effect transistors may be orientated on the substrate in a different manner than that depicted in FIG. 6B.

Figure 7A:
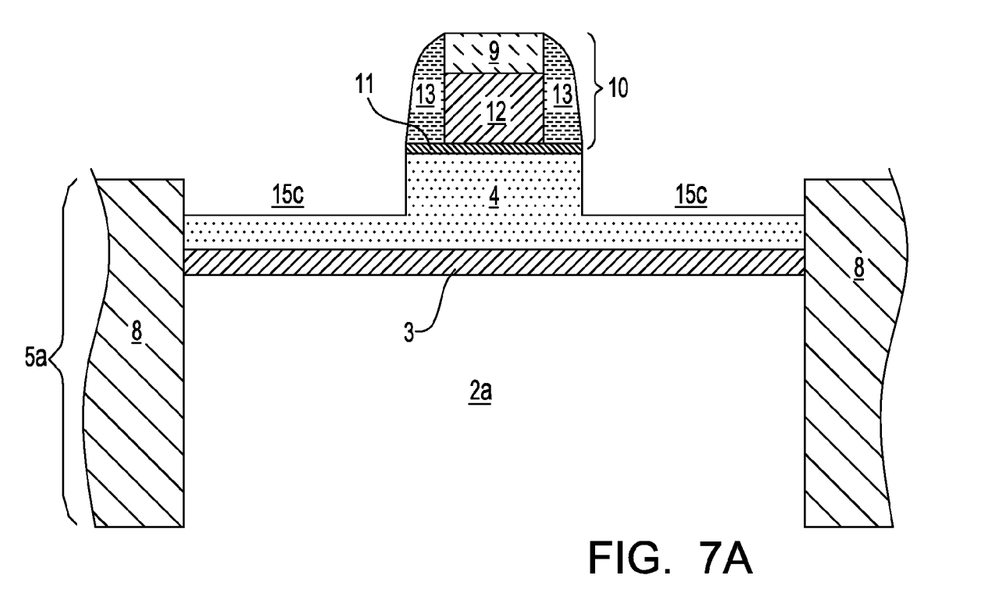
FIGS. 7a and 7b are side cross-sectional views of one embodiment of etching well trenches into the semiconductor layer that includes an anisotropic etch timed to form a first trench portion that does not extend to the germanium containing silicon layer, and an undercut etch that is selective to the (111) facet of the semiconductor layer, in accordance with the present disclosure.
Figure 7B:
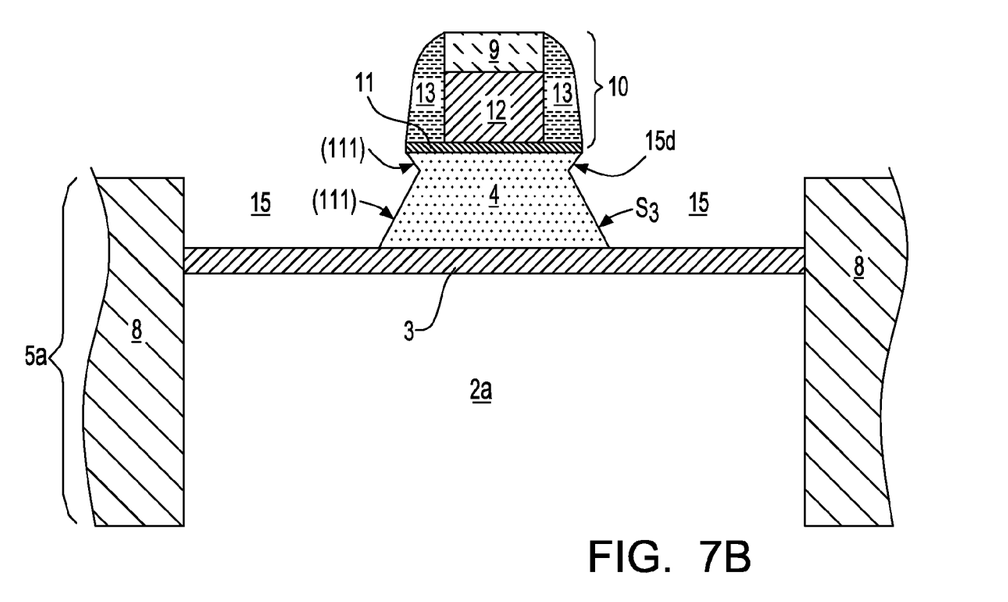

FIGS. 7A and 7B depict one embodiment of etching well trenches 15 into the semiconductor layer 4 on the opposing sides of the gate structure 10 with a method that includes an anisotropic etch that is timed to form a first trench portion 15c that does not extend to the germanium-containing silicon layer 3, and an undercut etch that is selective to the (111) facet of the semiconductor layer 4. The undercut etch forms an undercut region 15d that has a facetted sidewall. The depth to which the first trench portion 15c of the well trench is etched into the semiconductor layer 4 depicted in FIG. 7A may be selected to control the depth of the apex A2 in the semiconductor layer 4 that is formed by the undercut etch that is depicted in FIG. 7B. The anisotropic etch depicted in FIG. 7A is similar to the anisotropic etch that is described above with reference to FIG. 3 with the exception that the etch process is timed to be terminated once a selected depth for the first trench portion 15c is reached. For example, to provide an undercut region 15d in which the apex A2 of the facetted sidewall in present in the upper half of the semiconductor layer 4, as depicted in FIG. 7B, the final depth of the first trench portion 15c is selected to be within the upper half of the semiconductor layer 4, as depicted in FIG. 7A. In another example, to provide an undercut region 15d in which the apex A2 of the facetted sidewall in present in the lower half of the semiconductor layer 4, the final depth of the first trench portion 15c is selected to be within the lower half of the semiconductor layer 4. The undercut etch that forms the undercut region 15d depicted in FIG. 7B is similar to the undercut etch that forms the undercut region 15a depicted in FIG. 4. Therefore, the description of the etch process that forms the undercut region 15a depicted in FIG. 4 is suitable for the undercut region 15d that is depicted in FIG. 7B.

Figure 8:
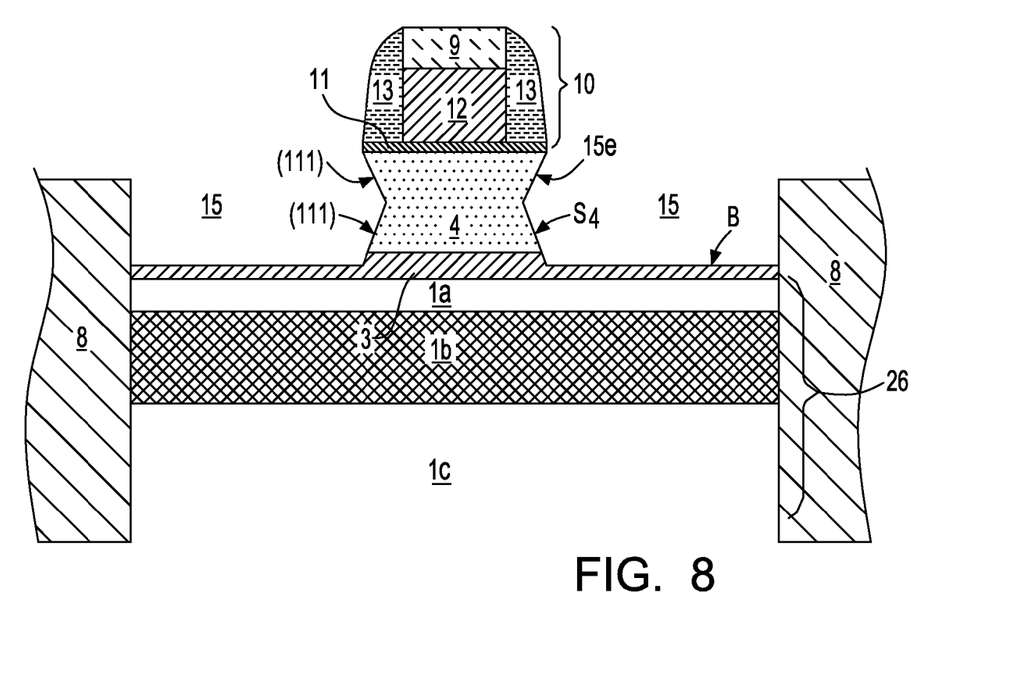
FIG. 8 is a side cross-sectional view that depicts well trenches formed in a semiconductor layer that is overlying a germanium-containing silicon layer, in which the germanium-containing silicon layer is present on the semiconductor on insulator (SOI) substrate that is depicted in FIG. 1B, in accordance with one embodiment of the present disclosure.
Figure 9:
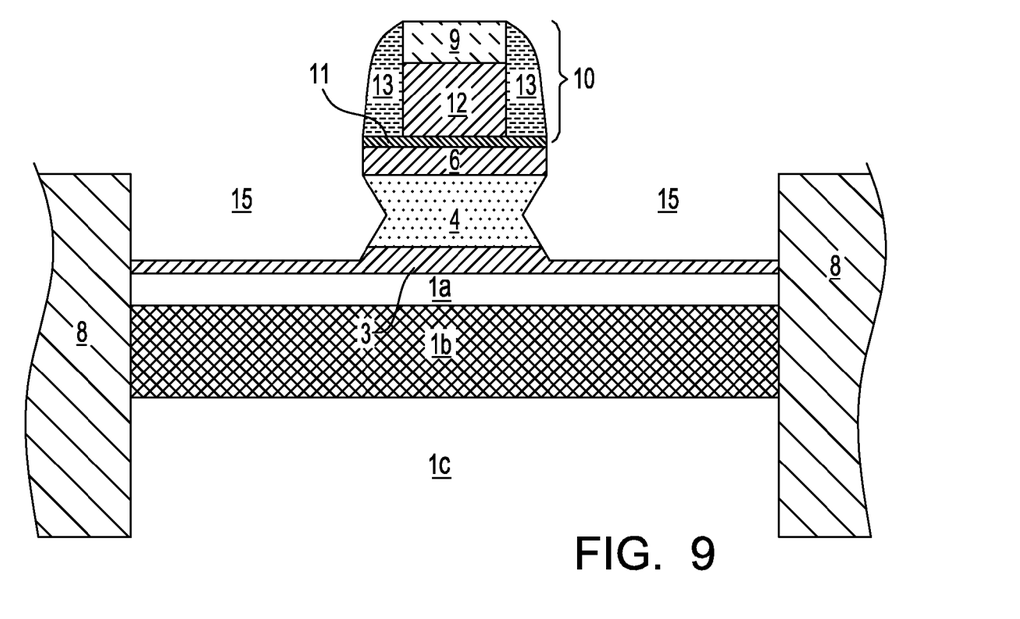
FIG. 9 is side cross-sectional view that depicts well trenches formed in a semiconductor layer that is overlying a germanium-containing silicon layer of a substrate, in which a silicon germanium (SiGe) layer is positioned between the gate structure and the semiconductor layer, as depicted in FIG. 1C, in accordance with the present disclosure.

FIG. 8 depicts one embodiment of well trenches 15 having facetted sidewalls S4 that are formed in semiconductor layer 4 overlying an SOI base substrate 2b, in which the base B of each well trench 15 is defined by the planar upper surface of a germanium-containing silicon layer that is present between the semiconductor layer 4 and the SOI base substrate 2b. The SOI base substrate 2b has been described above with reference to FIG. 1B. Referring to FIG. 8, each well trench 15 includes an undercut region 15e with a facetted sidewall S4 on opposing sides of a gate structure 10. The facetted sidewalls S4 of the undercut region 15e are provided by facets of the semiconductor layer 4 having a (111) orientation. The well trenches 15 having the undercut region 15e are formed by a two stage etch process including a first etch step including an anisotropic etch that removes the exposed portions of the semiconductor layer 4 selective to the germanium-containing silicon layer 3, the dielectric cap, and the spacers 13, and a second etch step comprising an undercut etch that is selective to the (111) facet of the semiconductor layer 4 and is selective to the germanium-containing silicon layer 3. The first etch step that includes the anisotropic etch is described above with reference to FIG. 3. The second etch step including the undercut etch is describe above with reference to FIG. 4. The structure depicted in FIG. 9 is similar to the structure depicted in FIG. 8 with the exception that a SiGe layer 6 is present atop the semiconductor layer 4 that is depicted in FIG. 9. The SiGe layer 6 is described above with reference to FIG. 1C.

FIGS. 10-12b depict epitaxially growing a stress inducing semiconductor material 60 to fill at least a portion of each of the well trenches 15. "Epitaxially growing, epitaxial growth and/or deposition" mean the growth of a semiconductor material on a deposition surface of a semiconductor material, in which the semiconductor material being grown has the same crystalline characteristics as the semiconductor material of the deposition surface. When the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation. If, on the other hand, the wafer surface has an amorphous surface layer, possibly the result of implanting, the depositing atoms have no surface to align to, resulting in the formation of polysilicon instead of single crystal silicon.

In each of the embodiments that are depicted in FIGS. 10-12b, the stress inducing source and drain regions have a base that is planar and is parallel to the upper surface of the substrate 5a, 5b. The stress inducing source and drain regions induce a stress on the channel portion of the semiconductor device that increases carrier mobility, and therefore increase the switching speed of the device. In some embodiments, the stress on the channel of the semiconductor device induced by the stress inducing source and drain regions has a magnitude ranging from 100 MPa to about 1000 MPa. In another example, the stress on the channel of the semiconductor device induced by the stress inducing source and drain regions has a magnitude ranging from 800 MPa to about 1000 MPa.

The stress inducing semiconductor material 60 that is epitaxially grown in the well trenches may be a compressive stress inducing material or a tensile stress inducing material. The term "compressive stress inducing material" denotes a material having an intrinsic compressive stress, in which the intrinsic compressive stress produces a compressive stress in an adjacent material. In one embodiment, the compressive stress inducing material comprises silicon germanium (SiGe) that is grown atop silicon (Si). Increasing the germanium content increases the lattice dimension of the silicon germanium and therefore increases the compressive stress that is induced by the compressive stress inducing material. Typically, stress inducing source and drain regions composed of compressive stress inducing materials increase the speed of hole charge carriers, and therefore provide performance enhancements, such as increased switching speed, in p-type semiconductor devices.

The term "tensile stress inducing material" denotes a material layer having an intrinsic tensile stress, in which the intrinsic tensile stress produces a tensile stress in an adjacent material. In one embodiment, the tensile stress inducing material comprises silicon doped with carbon (Si:C) that is grown atop silicon (Si). Increasing the carbon content decreases the lattice dimension of the silicon doped with carbon (Si:C), and therefore increases the tensile stress that is induced by the tensile stress inducing material. Typically, stress inducing source and drain regions composed of tensile stress inducing materials increase the speed of electron charge carriers, and therefore provide performance enhancements, such as increased switching speed, in n-type semiconductor devices.

Figure 10:
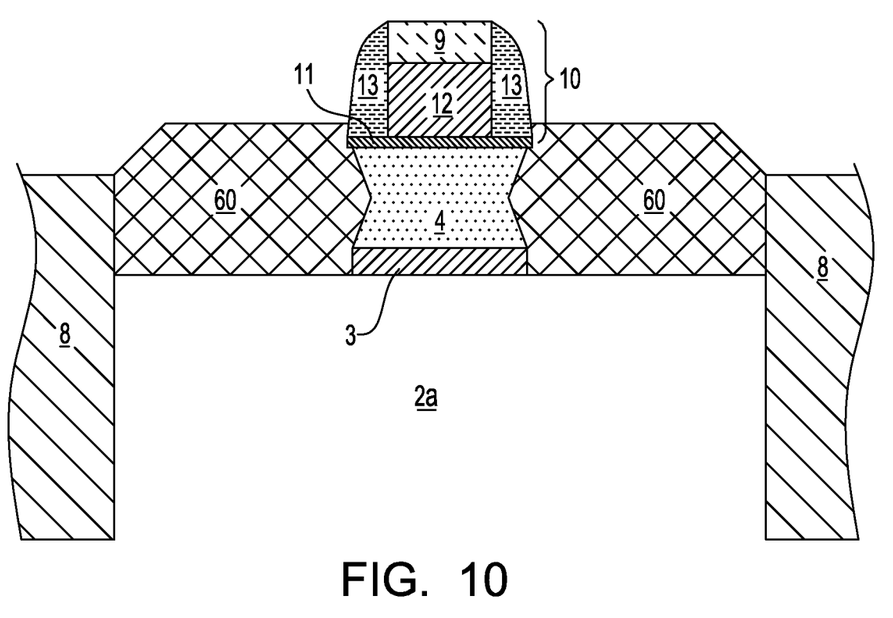
FIG. 10 is a side cross sectional view of epitaxially growing a stress inducing semiconductor material in the well trenches that are depicted in FIG. 4, wherein prior to the epitaxial growth of the semiconductor material the exposed portion of the germanium-containing silicon-layer is removed to expose a portion of the base substrate 2a, in accordance with one embodiment of the present disclosure.

FIG. 10 depicts epitaxially growing a stress inducing semiconductor material 60 in the well trenches 15 that are depicted in FIG. 4, in which the exposed portion of the germanium-containing silicon layer 3 is removed to expose a portion of the base substrate 2a, and the stress inducing semiconductor material 60 is epitaxially grown on the exposed surface of the base substrate 2a. In the embodiment that is depicted in FIG. 10, the exposed portion of the germanium-containing silicon layer 3 is removed by an etch that is selective to the base substrate material 2a prior to the epitaxial growth process that forms the stress inducing semiconductor material 60. In one embodiment, as the germanium-containing silicon layer 3 is etched preferentially in gaseous hydrochloric acid (HCl), the germanium-containing silicon layer 3 may be removed in-situ immediately before epitaxial growth, which provides a clean surface for the epitaxial growth process.

In the embodiments in which the base substrate material 2a is silicon, a stress inducing semiconductor material 60 having a lattice constant greater than silicon, e.g., silicon germanium, will provide a compressive stress inducing material. In the embodiments in which the base substrate material 2a is silicon, a stress inducing semiconductor material 60 having a lattice constant smaller than silicon, e.g., silicon doped with carbon (Si:C), will provide a tensile stress inducing material.

Figure 11:
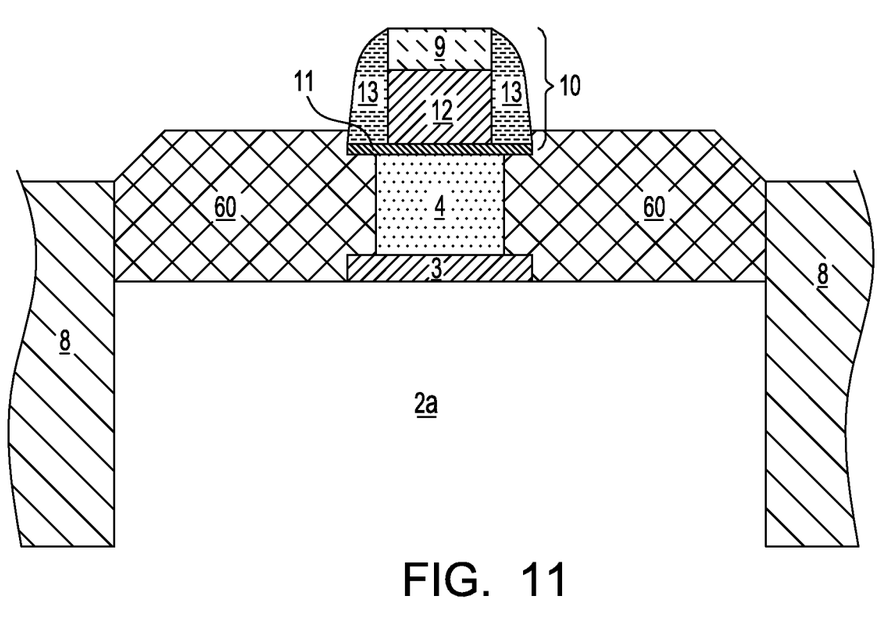
FIG. 11 is a side cross sectional view of epitaxially growing a stress inducing semiconductor material in the well trenches that are depicted in FIG. 5, wherein prior to the epitaxial growth of the semiconductor material the exposed portion of the germanium-containing silicon-layer is removed to expose a portion of the base substrate 2a, in accordance with one embodiment of the present disclosure.

FIG. 11 depicts epitaxially growing a stress inducing semiconductor material 60 in the well trenches 15 that are depicted in FIG. 5, in which the exposed portion of the germanium-containing silicon-layer 3 is removed to expose a portion of the base substrate 2a for the purpose of pre-cleaning the surface for epitaxial growth, and the stress inducing semiconductor material 60 is epitaxially grown on the exposed surface of the base substrate 2a. The materials described above for the stress inducing semiconductor material 60 with reference to FIG. 10 are applicable to the stress inducing semiconductor material 60 that is depicted in FIG. 11.

Figure 12A:
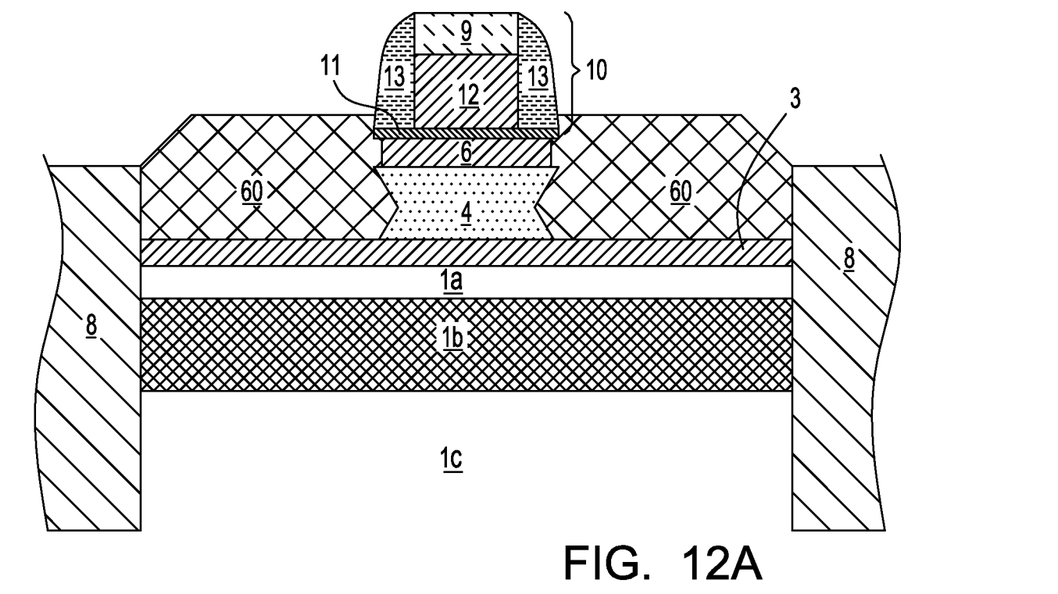
FIG. 12a is a side cross sectional view of epitaxially growing a stress inducing semiconductor material in the well trenches that are depicted in FIG. 9, in accordance with one embodiment of the present disclosure.
Figure 12B:
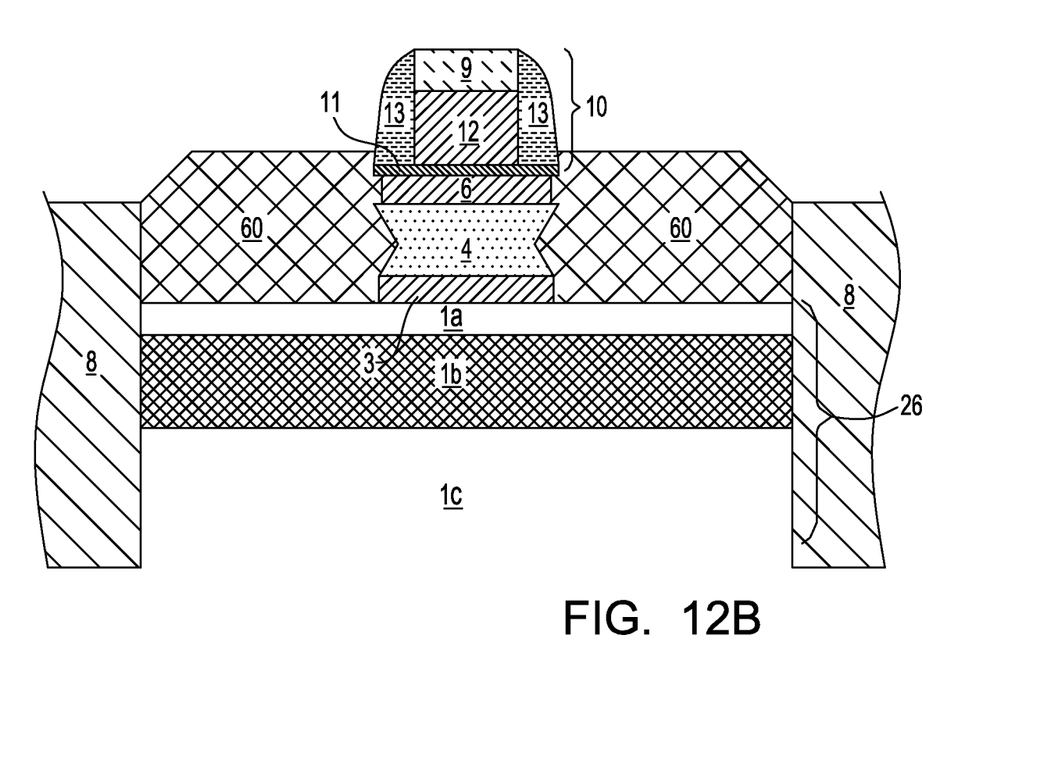
FIG. 12b is a side cross sectional view of epitaxially growing a stress inducing semiconductor material in the well trenches that are depicted in FIG. 9, wherein prior to the epitaxial growth of the semiconductor material the exposed portion of the germanium-containing silicon-layer is removed to expose a portion of the base substrate 2b, in accordance with one embodiment of the present disclosure.

FIG. 12a depicts one embodiment of epitaxially growing a stress inducing semiconductor material 60 in the well trenches that are depicted in FIG. 9. Similar to the embodiments described above with reference to FIG. 10, the germanium-containing silicon layer 3 may function as a seed layer. FIG. 12b depicts one embodiment of epitaxially growing a stress inducing semiconductor material 60 in the well trenches that are depicted in FIG. 9, wherein prior to the epitaxial growth of the strain inducing semiconductor material 60, the exposed portion of the germanium-containing silicon-layer 3 is removed to expose a portion of the SOI layer 1a of the base substrate 2b. The materials described above for the stress inducing semiconductor material 60 with reference to FIG. 10 are applicable to the stress inducing semiconductor material 60 that is depicted in FIG. 11.

A number of different sources may be used for the epitaxial deposition of silicon-germanium for the stress inducing semiconductor material 60. In some embodiments, the gas source for the deposition of epitaxial SiGe may include a mixture of silane ($SiH_4$), and germane ($GeH_4$) gas. The Ge content of the epitaxial grown SiGe may range from 5% to 60%, by atomic weight %. In another embodiment, the Ge content of the epitaxial grown SiGe may range from 10% to 40%. In the embodiments, in which the stress inducing semiconductor material 60 is composed of epitaxially grown Si:C or carbon doped silicon, the carbon (C) content of the epitaxial grown Si:C may range from 0.3% to 5%, by atomic weight %. In another embodiment, the carbon (C) content of the epitaxial grown Si:C may range from 1% to 2%.

The stress inducing semiconductor material 60 may be doped with an n-type or p-type dopant to provide the source and drain regions of the semiconductor device, e.g., field effect transistor. The stress inducing semiconductor material 60 may be in-situ doped to provide the source and drain regions of the semiconductor device. The term "in-situ doped" means that the dopant that provides the conductivity of the stress inducing semiconductor material 60 that provides the source and drain regions is introduced during the epitaxial growth process. The stress inducing material 60 may also be doped with an n-type or p-type dopant using ion implantation after the growth of the epitaxial material.

In the silicon-containing stress inducing semiconductor material 60, examples of p-type dopants, i.e., impurities, include but are not limited to, boron, aluminum, gallium and indium. In one example, in which the in-situ doped semiconductor material is doped to provide a p-type conductivity, the dopant may be boron present in a concentration ranging from $1\times10^{19}$ atoms/cm$^3$ to $2\times10^{21}$ atoms/cm$^3$. In a silicon containing stress inducing semiconductor material 60, examples of n-type dopants, i.e., impurities, include but are not limited to antimony, arsenic and phosphorous. In one example, in which the in-situ doped semiconductor material is doped to provide an n-type conductivity, the dopant may be phosphorus present in a concentration ranging from $1\times10^{19}$ atoms/cm$^3$ to $2\times10^{21}$ atoms/cm$^3$.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

What is claimed is:

1. A method of forming a semiconductor device comprising:
    providing a substrate including a semiconductor layer on a germanium-containing silicon layer, wherein a base semiconductor layer is present underlying the germanium-containing silicon layer;
    forming a gate structure on a surface of a channel portion of the semiconductor layer of the substrate;
    etching well trenches into the substrate on opposing sides of the gate structure by removing the entirety of said semiconductor layer on opposing sides of the gate structure and a portion of the underlying germanium-containing silicon layer, wherein said etching provides a recess in said germanium-containing silicon layer;
    conducting a second etch step comprising an undercut etch that is selective to the (111) facet of the semiconductor layer and is selective to the recessed germanium-containing silicon layer, wherein the second step is a wet etch using tetramethylammonium hydroxide (TMAH);
    removing remaining portions of the recessed germanium-containing silicon layer located on opposing sides of the gate structure to expose a portion of the base semiconductor layer, while keeping a remaining portion of the germanium-containing silicon layer under the gate structure untouched; and
    epitaxially growing a stress inducing semiconductor material in direct contact with the portion of the base semiconductor layer that is exposed to fill at least a portion of each well trench to provide at least one of a stress inducing source region and a stress inducing drain region having a planar base.

2. The method of claim 1, wherein the semiconductor layer is composed of greater than 90% silicon and has a (100) orientation.

3. The method of claim 1, wherein the germanium-containing silicon layer comprises greater than 20% germanium.

4. The method of claim 1, wherein the forming of the gate structure comprises:
    forming a gate stack comprised of at least one gate dielectric layer on the semiconductor layer, at least one gate conductor layer on the at least one gate dielectric layer, and at least one gate dielectric cap on the at least one gate conductor layer;
    forming an etch mask over the gate stack;
    etching the gate stack selective to the etch mask to form the gate structure; and
    forming at least one sidewall spacer adjacent to the gate structure.

5. The method of claim 1, wherein the undercut etch forms an undercut region having sidewalls defined by two (111) facets intersecting at an apex underlying the gate structure.

6. The method of claim 1, wherein the epitaxially growing of the stress inducing semiconductor material on the portion of the base semiconductor layer that is exposed comprises growing a silicon germanium (SiGe) material or a silicon doped with carbon (Si:C) material to fill at least a portion of the well trench, wherein the silicon germanium (SiGe) material induces a compressive stress on the channel region, and the silicon doped with carbon (Si:C) material induces a tensile stress on the channel region.

7. The method of claim 6, wherein the silicon germanium (SiGe) material is doped to a p-type conductivity, and the silicon doped with carbon (Si:C) material is doped to an n-type conductivity.

8. The method of claim 7, wherein the dopant that provides the p-type conductivity or the dopant that provides the n-type conductivity is introduced to the stress inducing semiconductor material by an in-situ doping process or is introduced to the stress inducing semiconductor material by ion implantation.

* * * * *